(12) United States Patent
Chan et al.

(10) Patent No.: US 8,115,381 B2
(45) Date of Patent: Feb. 14, 2012

(54) TOP-EMISSION ACTIVE MATRIX ELECTROLUMINECIENT DEVICE

(75) Inventors: Chuan-Yi Chan, Chu-Nan (TW); Du-Zen Peng, Chu-Nan (TW); Ryuji Nishikawa, Chu-Nan (TW)

(73) Assignee: Chimei Innolux Corporation, Chu-Nan (TW)

( * ) Notice: Subject to any disclaimer, the term of this patent is extended or adjusted under 35 U.S.C. 154(b) by 546 days.

(21) Appl. No.: 12/290,150

(22) Filed: Oct. 27, 2008

(65) Prior Publication Data

US 2009/0146559 A1 Jun. 11, 2009

(30) Foreign Application Priority Data

Dec. 11, 2007 (TW) .............................. 96147164 A

(51) Int. Cl.
*H01L 31/0232* (2006.01)
*H01L 31/12* (2006.01)

(52) U.S. Cl. ......................... 313/505; 313/498; 313/506

(58) Field of Classification Search ........... 313/498–512
See application file for complete search history.

(56) References Cited

U.S. PATENT DOCUMENTS 7,187,116 B2    3/2007  Lee
2003/0156239 A1* 8/2003  Inoue et al. ................. 349/113
2004/0113544 A1* 6/2004  Murakami et al. ............ 313/504
2005/0218794 A1* 10/2005  Seo et al. ..................... 313/504
2008/0284327 A1* 11/2008  Kang et al. .................. 313/504

OTHER PUBLICATIONS

N. Thomas and J. Wolfe, "High reflectivity of silver extended down to 200 nm," in Optical Interference Coatings, OSA Technical Digest Series (Optical Society of America, 2001), paper TuF2, http://www.opticsinfobase.org/abstract.cfm?URI=OIC-2001-TuF2.*
Yang, et al., 59.4: Microcavity Top-Emitting OLEDs Integrated with Microlens Arrays: Simultaneous Enhancement of Quantum Efficiency . . . , SID '07 Digest, pp. 1698-1700.

* cited by examiner

*Primary Examiner* — Joseph L Williams
*Assistant Examiner* — Nathaniel Lee
(74) *Attorney, Agent, or Firm* — Liu & Liu

(57) ABSTRACT

This invention provides a top-emission active matrix electroluminescent device including a substrate and a plurality of pixel areas formed within a display area of the substrate. Each of the pixel areas includes at least one sub-pixel area comprising at least, from top to bottom: a first conductive electrode layer, an electroluminescent layer, a second conductive electrode layer, a first reflective layer region, and a second reflective layer region. The first reflective layer region and second reflective layer region overlap each other in part. Some of the light rays emitted from the electroluminescent layer are reflected by the first reflective layer region and second reflective layer region, respectively, and are then directed upwards. The reflected light rays compensate the top-emitting light rays also emitted from the electroluminescent layer, reducing color shifts at different viewing angles due to the micro-cavity effect.

27 Claims, 4 Drawing Sheets

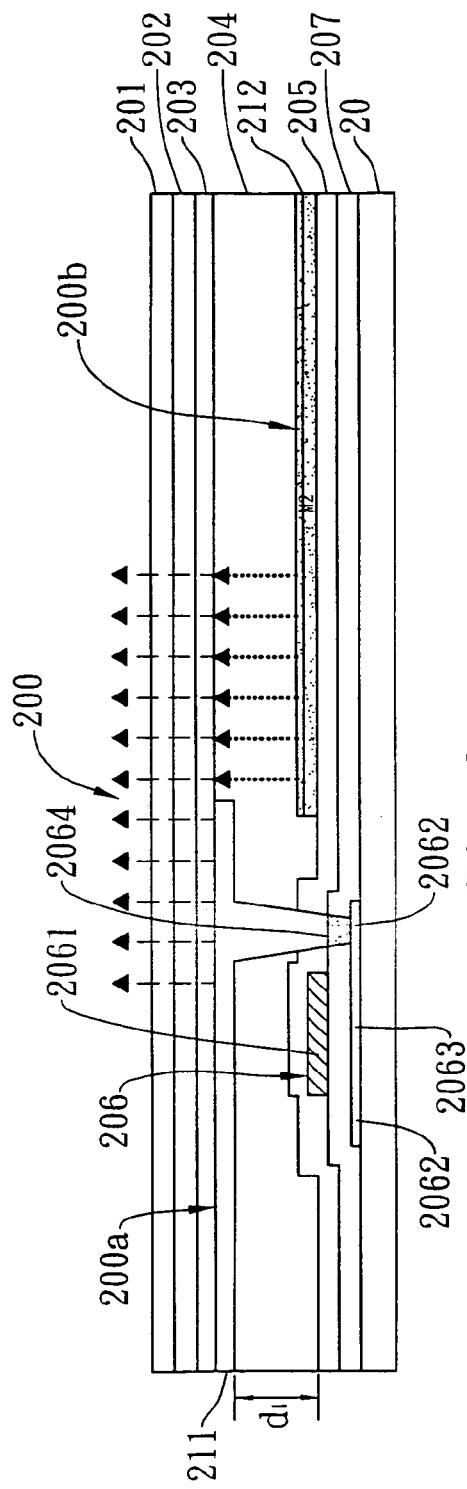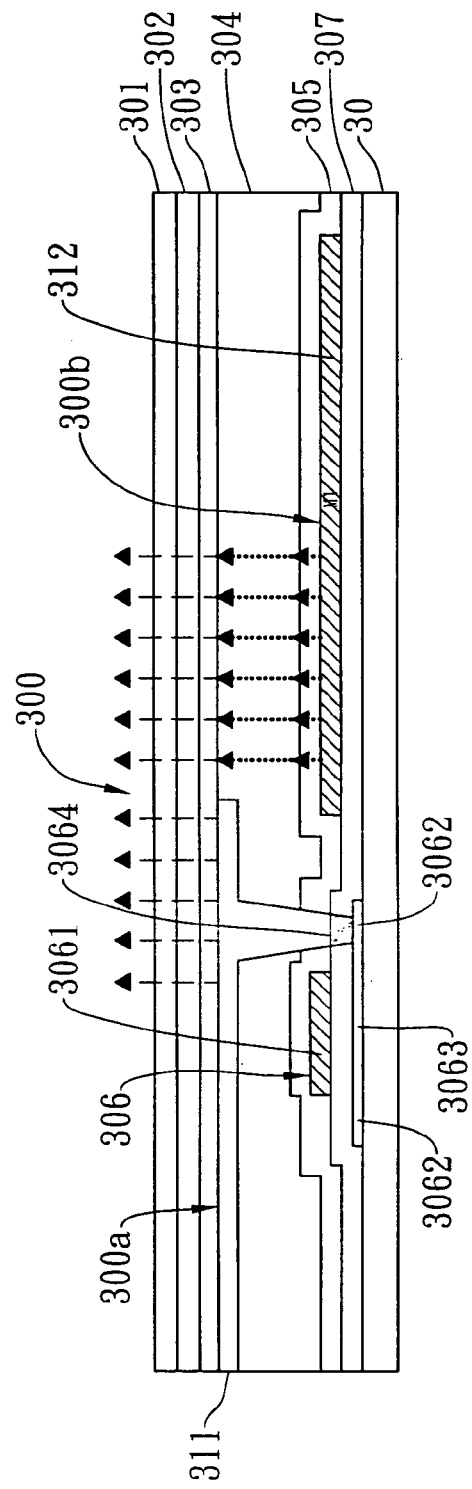

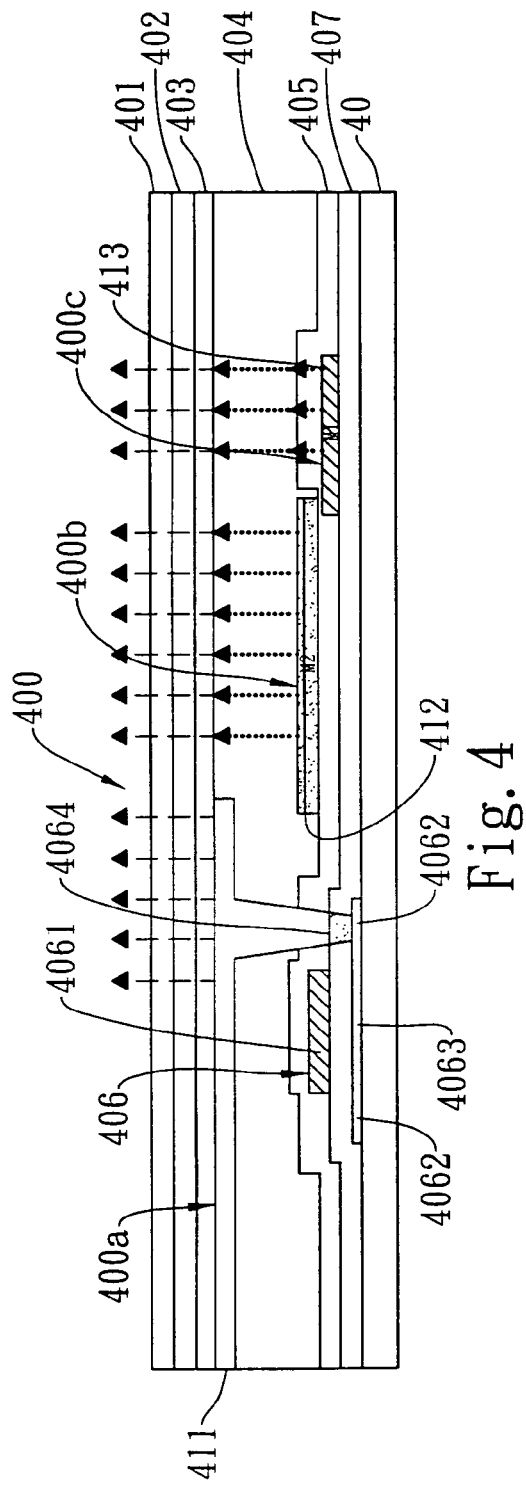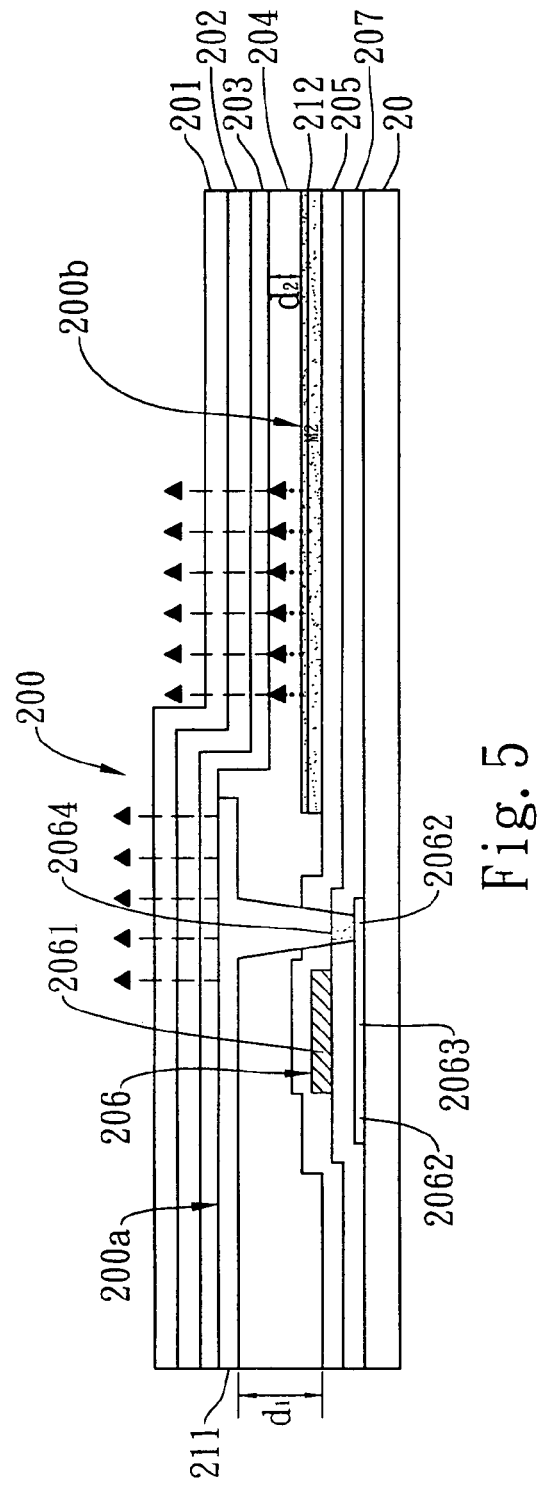

TOP-EMISSION ACTIVE MATRIX ELECTROLUMINECIENT DEVICE

BACKGROUND OF THE INVENTION

1. Field of the Invention

The present invention relates to an active matrix electroluminescent device, and more particularly, to a top-emission active matrix electroluminescent device.

2. Description of the Related Art

Electroluminescent display devices are active display devices that have many advantages over cathode-ray tubes (CRTs) or liquid crystal displays (LCDs). For example, an electroluminescent display device typically has a wide viewing angle, high brightness and contrast, high response speed, light weight, small size, thin thickness, and low power consumption. FIG. 1A is a schematic cross-sectional view showing the partial structure of a conventional top-emission active matrix electroluminescent device corresponding to a pixel area. The conventional electroluminescent device mainly comprises, from top to bottom: a transparent cathode layer 101, an electroluminescent layer 102, a transparent anode layer 103, a metallic reflective layer 104, a passivation layer 105, a dielectric layer 106, an insulating layer 107, a driving thin-film transistor (TFT) 108, and a bottom substrate 100. The driving TFT 108 is located between the dielectric layer 106 and the bottom substrate 100. Referring to FIG. 1B, some of the light emitted from the electroluminescent layer 102 is respectively reflected by the transparent cathode layer 101, the electroluminescent layer 102 where light emission occurs, and the transparent anode layer 103. This produces a micro-cavity effect between the transparent cathode layer 101 and the transparent anode layer 103. On one hand, the micro-cavity effect improves emission luminance of the conventional electroluminescent device, and on the other hand, it results in color shift at different viewing angles, which is a serious drawback with the conventional electroluminescent device.

SUMMARY OF THE INVENTION

The present invention provides a top-emission active matrix electroluminescent device that includes a plurality of reflective regions formed under the electroluminescent layer of the device, wherein each reflective region has a different optical path length. By reflecting part of the light from the electroluminescent layer through each reflective region, the reflected light can emit upward. The reflected light compensates the top-emission light also emitted from the electroluminescent layer, which reduces color shift at different viewing angles induced by micro-cavity effect.

A top-emission active matrix electroluminescent device of the present invention includes a substrate and a plurality of pixel areas formed within a display area of the substrate. Each of the pixel areas includes at least one sub-pixel area comprising at least, from top to bottom: a first conductive electrode layer, an electroluminescent layer, a second conductive electrode layer, a first reflective layer region and a second reflective layer region. The first reflective layer region and the second reflective layer region overlap each other in part.

Moreover, the top-emission active matrix electroluminescent device of the present invention further comprises a passivation layer between the first reflective layer region and the second reflective layer region. By adjusting the thickness of the passivation layer, the color shift induced by the micro-cavity effect of the electroluminescent device at different viewing angles can be reduced.

In addition, the present invention provides an alternative top-emission active matrix electroluminescent device, which includes a substrate and a plurality of pixel areas formed within a display area of the substrate. Each of the pixel areas includes at least one sub-pixel area comprising at least, from top to bottom: a first conductive electrode layer, an electroluminescent layer, a second conductive electrode layer, a first reflective layer region, a second reflective layer region and a third reflective layer region. The first reflective layer region overlaps one side of the second reflective layer region in part, and the opposite side of the second reflective layer region overlaps the third reflective layer region in part.

The alternative top-emission active matrix electroluminescent device also comprises a passivation layer which is under the first reflective layer region and which covers the second reflective layer region and the third reflective layer region. An insulating layer is further provided between the second reflective layer region and the third reflective layer region, and in consequence, the first reflective layer region, the second reflective layer region and the third reflective layer region can have different optical path lengths, which helps to reduce the color shift induced by the micro-cavity effect of the electroluminescent device at different viewing angles.

BRIEF DESCRIPTION OF THE DRAWINGS

FIG. 2 is a schematic cross-sectional view showing the partial structure of a top-emission active matrix electroluminescent device according to a first embodiment of the present invention;

FIG. 3 is a schematic cross-sectional view showing the partial structure of a top-emission active matrix electroluminescent device according to a second embodiment of the present invention;

FIG. 4 is a schematic cross-sectional view showing the partial structure of a top-emission active matrix electroluminescent device according to a third embodiment of the present invention;

FIG. 5 is a schematic cross-sectional view showing the partial structure of a top-emission active matrix electroluminescent device according to an alternative of the first embodiment shown in FIG. 2.

DETAILED DESCRIPTION OF THE PREFERRED EMBODIMENTS

Figure 1A:
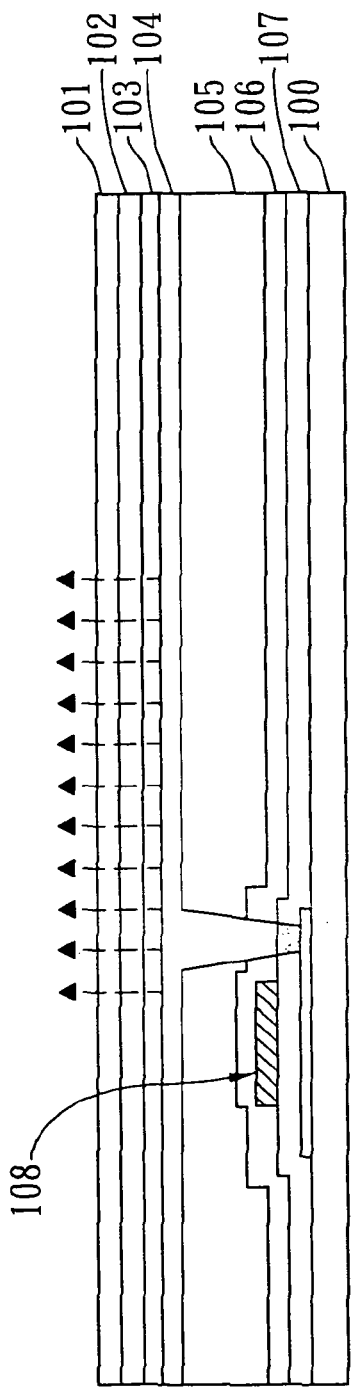
FIG. 1A is a schematic cross-sectional view showing the partial structure of a conventional top-emission active matrix electroluminescent device.
Figure 1B:
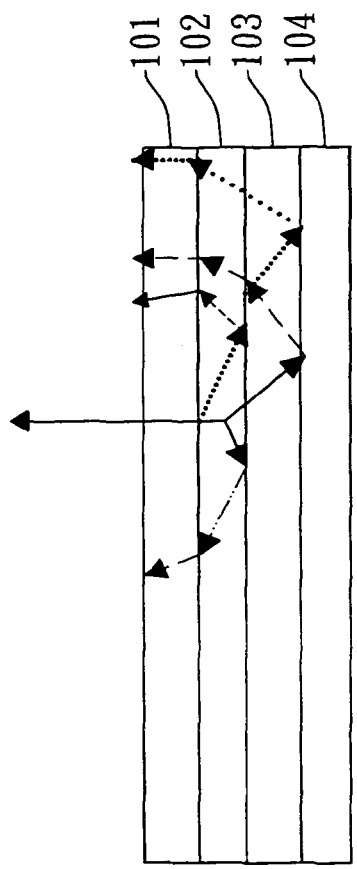
FIG. 1B illustrates the reflections in each layer of the electroluminescent device in FIG. 1A.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

FIG. 2 is a schematic cross-sectional view showing the partial structure of a top-emission active matrix electroluminescent device corresponding to a sub-pixel area, according to a first embodiment of the present invention. In this embodiment, the top-emission active matrix electroluminescent device at least includes one bottom substrate 20, such as glass substrate, and a plurality of pixel areas formed within a display area of the bottom substrate 20. Each of the pixel areas includes at least one sub-pixel area 200 comprising at least, from top to bottom: a first conductive electrode layer 201, an electroluminescent layer 202, a second conductive electrode layer 203, a first reflective layer region 200a, a passivation layer 204, a second reflective layer region 200b, a first insulating layer 205, a driving TFT 206, and a second insulating layer 207. The first conductive electrode layer 201 can be either anode or cathode, and the second conductive electrode layer 203 shall be the other electrode. The electroluminescent layer 202 which comprises at least one organic electroluminescent layer is sandwiched between the first conductive electrode layer 201 and the second conductive electrode layer 203. The first reflective layer region 200a is located under the second conductive electrode layer 203 but does not cover the entire sub-pixel area 200. The first reflective layer region 200a includes a first reflective layer 211 with a thickness which is smaller than 0.5 μm preferably, and the first reflective layer 211 is electrically coupled to the second conductive electrode layer 203. The passivation layer 204 is formed between the first reflective layer region 200a and the second reflective layer region 200b, wherein the first reflective layer region 200a and the second reflective layer region 200b overlap each other in part. Moreover, the second reflective layer region 200b does not cover the entire sub-pixel area 200. The thickness of the second reflective layer region is smaller than 0.5 μm preferably. The passivation layer 204 can be a flat layer such that its thickness, which is greater than 1 μm preferably, can be adjusted easily. A part of the passivation layer 204 under the first reflective layer region 200a has a thickness $d_1$. The first insulating layer 205 is located under the second reflective layer region 200b and covers the entire sub-pixel area 200. The second insulating layer 207 is located between the first insulating layer 205 and the bottom substrate 20. The driving TFT 206 is located on the bottom substrate 20 and below the first reflective layer region 200a. And part of the second insulating layer 207 serves as the gate insulating layer for the driving TFT 206. The driving TFT 206 includes a gate electrode layer 2061, a pair of source/drain regions 2062, a channel region 2063, and a gate insulating layer 207. A metallic contact 2064 is formed at the top of the source or drain region 2062. The metallic contact 2064 extends through the second insulating layer 207 and is electrically coupled to the bottom of the first reflective layer 211 to constitute a data line connection within the sub-pixel area 200. The metallic contact 2064 is made of a composite metal layer comprising three metal sub-layers, such as Mo/Al/Mo or Ti/Al/Ti sublayers. In a semiconductor device, such as an electroluminescent device of the present invention, a metal layer that serves as the gate electrode layer of the semiconductor device is generally called the first metal layer (M1 layer), and another metal layer that serves as the metallic contact for the source/drain region of the semiconductor device is generally called the second metal layer (M2 layer). In the first embodiment of the present invention, the second reflective layer region 200b includes a second reflective layer 212 which can be the same composite metal layer constituting the metallic contact 2064 except that for the second reflective layer 212, the top sub-layer is removed from the composite metal layer. In other words, the second reflective layer 212 can include, but is not limited to, the M2 layer that constitutes the metallic contact 2064 for the source/drain region 2062 in a process for fabricating an electroluminescent device of the present invention, yet the second reflective layer 212 can also be a layer made of single metal, such as an aluminum layer.

In the first embodiment, part of the light from the electroluminescent layer 202 emits toward the first reflective layer region 200a and the second reflective layer region 200b, through both of which the part of the light is reflected and returns to the region between the first conductive electrode layer 201 and the second conductive electrode layer 203. Then, said part of the light may be emitted directly out of the top of the electroluminescent device 200; otherwise, it may be emitted out of the top of the electroluminescent device 200 after a micro-cavity effect occurs within the region between the first conductive electrode layer 201 and the second conductive electrode layer 203. As shown in FIG. 2, the optical path length of the light reflected from the first reflective layer region 200a is different from that of the light reflected from the second reflective layer region 200b. Consequently, when the light reflected respectively from the first reflective layer region 200a and from the second reflective layer region 200b return to the region between the first conductive electrode layer 201 and the second conductive electrode layer 203, the two reflected lights have different wavelengths for producing a micro-cavity effect. Thus, the two reflected lights can compensate each other when they are subsequently emitted out of the top of the electroluminescent device. This reduces color shift induced by the micro-cavity effect at different viewing angles and then improves the micro-cavity effect.

As described above, by adjusting the thickness of the passivation layer 204 in the present invention, color shift can be reduced to the utmost. Furthermore, the first reflective layer 211 can be a single layer made of one metal, or a composite layer made of plural metal sub-layers. Preferably, reflectivities of the first reflective layer region 200a and of the second reflective layer region 200b are greater than 30%, such as reflectivities ranging from 50% to 100%.

FIG. 3 is a schematic cross-sectional view showing the partial structure of a top-emission active matrix electroluminescent device according to a second embodiment of the present invention. In the second embodiment, the top-emission active matrix electroluminescent device at least includes one bottom substrate 30, such as glass substrate, and a plurality of pixel areas formed within a display area of the bottom substrate 30. Each of the pixel areas includes at least one sub-pixel area 300 comprising at least, from top to bottom: a first conductive electrode layer 301, an electroluminescent layer 302, a second conductive electrode layer 303, a first reflective layer region 300a, a passivation layer 304, a first insulating layer 305, a second reflective layer region 300b, a driving TFT 306, and a second insulating layer 307. The first conductive electrode layer 301 may be either anode or cathode, while the second conductive electrode layer 303 shall be the other electrode. The electroluminescent layer 302 which is sandwiched between the first conductive electrode layer 301 and the second conductive electrode layer 303 can comprise at least one organic electroluminescent layer. The first reflective layer region 300a is located under the second conductive electrode layer 303 but does not cover the entire sub-pixel area 300. The first reflective layer region 300a includes a first reflective layer 311 with a thickness which is preferable to be smaller than 0.5 μm, and the first reflective layer 311 is electrically coupled to the second conductive electrode layer 303. The passivation layer 304 is formed between the first reflective layer region 300a and the first insulating layer 305. The second reflective layer region 300b is located under the first insulating layer 305, and overlaps the first reflective layer region 300a in part. Moreover, the second reflective layer region 300b does not cover the entire sub-pixel area 300 and has a thickness smaller than 0.5 µm preferably. The passivation layer 304 may be a flat layer such that its thickness, which is greater than 1 µm preferably, can be adjusted easily. The second insulating layer 307 is located between the second reflective layer region 300b and the bottom substrate 30, covering the entire sub-pixel area 300. The driving TFT 306 is located on the bottom substrate 30 and below the first reflective layer region 300a, while part of the second insulating layer 307 serves as the gate insulating layer for the driving TFT 306. The driving TFT 306 includes a gate electrode layer 3061, a pair of source/drain regions 3062, a channel region 3063, and a gate insulating layer 307. A metallic contact 3064 is formed at the top of the source or drain region 3062. The metallic contact 3064 extends through the second insulating layer 307 and then is electrically coupled to the bottom of the first reflective layer 311 to constitute a data line connection within the sub-pixel area 300. The metallic contact 3064 is made of a composite metal layer comprising three metal sub-layers, such as Mo/Al/Mo or Ti/Al/Ti sub-layers. In the second embodiment of the present invention, the second reflective layer region 300b includes a second reflective layer 312 which can be the same metal layer constituting the gate electrode layer 3061. In other words, in a process for fabricating an electroluminescent device of the present invention, the second reflective layer 312 can include, but is not limited to, the M1 layer that constitutes the gate electrode layer 3061. The second reflective layer 312 can be a single layer made of one metal, or a composite layer made of plural metal sub-layers.

In the second embodiment, part of the light from the electroluminescent layer 302 emits toward the first reflective layer region 300a and the second reflective layer region 300b, through both of which the part of the light is reflected and returns to the region between the first conductive electrode layer 301 and the second conductive electrode layer 303. Then, the part of the light may be emitted directly out of the top of the electroluminescent device 300; otherwise, it may be emitted out of the top of the electroluminescent device 300 after a micro-cavity effect occurs within the region between the first conductive electrode layer 301 and the second conductive electrode layer 303. As shown in FIG. 3, the light reflected from the first reflective layer region 300a has an optical path length different from that of the light reflected from the second reflective layer region 300b. Consequently, when the light reflected respectively from the first reflective layer region 300a and from the second reflective layer region 300b return to the region between the first conductive electrode layer 301 and the second conductive electrode layer 303, the two reflected lights have different wavelengths for producing a micro-cavity effect. Thus, after the micro-cavity effect occurs, the two types of lights can compensate each other when they are subsequently emitted out of the top of the electroluminescent device. This reduces color shift induced by the micro-cavity effect at different viewing angles and then improves the micro-cavity effect.

As described above, by adjusting the thickness of the passivation layer 304 in the present invention, color shift can be reduced to the utmost. Furthermore, the first reflective layer 311 can be a single layer made of one metal, or a composite layer made of plural metal sub-layers. Preferably, reflectivities of the first reflective layer region 300a and of the second reflective layer region 300b are greater than 30%, such as reflectivities ranging from 50% to 100%.

FIG. 4 is a schematic cross-sectional view showing the partial structure of a top-emission active matrix electroluminescent device according to a third embodiment of the present invention. In the third embodiment, the top-emission active matrix electroluminescent device at least includes one bottom substrate 40, such as glass substrate, and a plurality of pixel areas formed within a display area of the bottom substrate 40. Each of the pixel areas includes at least one sub-pixel area 400 comprising at least, from top to bottom: a first conductive electrode layer 401, an electroluminescent layer 402, a second conductive electrode layer 403, a first reflective layer region 400a, a passivation layer 404, a second reflective layer region 400b, a first insulating layer 405, a third reflective layer region 400c, a driving TFT 406, and a second insulating layer 407. The first conductive electrode layer 401 can be either anode or cathode, while the second conductive electrode layer 403 shall be the other electrode. The electroluminescent layer 402 which is sandwiched between the first conductive electrode layer 401 and the second conductive electrode layer 403 can comprise at least one organic electroluminescent layer. The first reflective layer region 400a is located under the second conductive electrode layer 403 but does not cover the entire sub-pixel area 400. The first reflective layer region 400a includes a first reflective layer 411 with a thickness which is preferable to be smaller than 0.5 µm, and the first reflective layer 411 is electrically coupled to the second conductive electrode layer 403. The passivation layer 404 is formed between the first reflective layer region 400a and the second reflective layer region 400b, with the two reflective layer regions overlapping each other in part. The second reflective layer region 400b does not cover the entire sub-pixel area 400 and has a thickness smaller than 0.5 µm preferably. The passivation layer 404 can be a flat layer such that its thickness, which is greater than 1 µm preferably, can be adjusted easily. The first insulating layer 405 is located under the second reflective layer region 400b and covers the entire sub-pixel area 400. The third reflective layer region 400c is located between the first insulating layer 405 and the second insulating layer 407. The third reflective layer region 400c overlaps one side, which is opposite to the first reflective layer region 400a, of the second reflective layer region 400b in part, having a thickness smaller than 0.5 µm preferably. The second insulating layer 407 is located between the first insulating layer 405 and the bottom substrate 40. The driving TFT 406 is located on the bottom substrate 40 and below the first reflective layer region 400a, while part of the second insulating layer 407 serves as a gate insulating layer for the driving TFT 406. The driving TFT 406 includes a gate electrode layer 4061, a pair of source/drain regions 4062, a channel region 4063, and a gate insulating layer 407. A metallic contact 4064 is formed at the top of the source or drain region 4062. The metallic contact 4064 extends through the second insulating layer 407 and then is electrically coupled to the bottom of the first reflective layer 411 to constitute a data line connection within the sub-pixel area 400. The metallic contact 4064 is made of a composite metal layer comprising three metal sub-layers, such as Mo/Al/Mo or Ti/Al/Ti sub-layers. In the third embodiment of the present invention, the second reflective layer region 400b includes a second reflective layer 412 which can be the same metal layer constituting the metallic contact 4064 except that for the second reflective layer 412, the top sub-layer is removed from the composite metal layer. In other words, in a process for fabricating an electroluminescent device of the present invention, the second reflective layer 412 may include, but is not limited to, the M2 layer, which may be a single layer made of one metal, such as an aluminum layer. The third reflective layer region 400c includes a third reflective layer 413 which can be the same metal layer constituting the gate electrode layer 4061 of the driving TFT 406. In other words, in a process for fabricating an electroluminescent device of the present invention, the third reflective layer 413 may include, but is not limited to, the M1 layer, which may be a single layer made of one metal, or a composite layer made of plural metal sub-layers.

In the third embodiment, part of the light from the electroluminescent layer 402 emits toward the first reflective layer region 400a, the second reflective layer region 400b and the third reflective layer region 400c, through all of which the part of the light is reflected and returns to the region between the first conductive electrode layer 401 and the second conductive electrode layer 403. Then, the part of the light may be emitted directly out of the top of the electroluminescent device 400; otherwise, it may be emitted out of the top of the electroluminescent device 400 after a micro-cavity effect occurs within the region between the first conductive electrode layer 401 and the second conductive electrode layer 403. As shown in FIG. 4, the light reflected from the first reflective layer region 400a has an optical path length different from that of the light reflected from the second reflective layer region 400b and different from that of the light reflected from the third reflective layer region 400c. Consequently, when the light reflected respectively from the first reflective layer region 400a, the second reflective layer region 400b and the third reflective layer region 400c return to the region between the first conductive electrode layer 401 and the second conductive electrode layer 403, the three reflected lights have different wavelengths for producing a micro-cavity effect. Thus, the three reflected lights can compensate one another when they are subsequently emitted out of the top of the electroluminescent device. This reduces the color shift induced by the micro-cavity effect at different viewing angles and then improves the micro-cavity effect.

As described above, by adjusting the thickness of the passivation layer 404 in the present invention, the color shift can be reduced to the utmost. Furthermore, the first reflective layer 411 can be a single layer made of one metal, or a composite layer made of plural metal sub-layers. Preferably, reflectivities of the first reflective layer region 400a, of the second reflective layer region 400b and of the third reflective layer region 400c are greater than 30%, such as reflectivities ranging from 50% to 100%.

FIG. 5 shows an alternative of the first embodiment (as shown in FIG. 2) described above. The difference between this alternative and the first embodiment is that the thickness $d_1$ of the passivation layer 204 corresponding to the first reflective layer region 200a is greater than the thickness $d_2$ of the passivation layer 204 corresponding to the second reflective layer region 200b.

Figure 6:
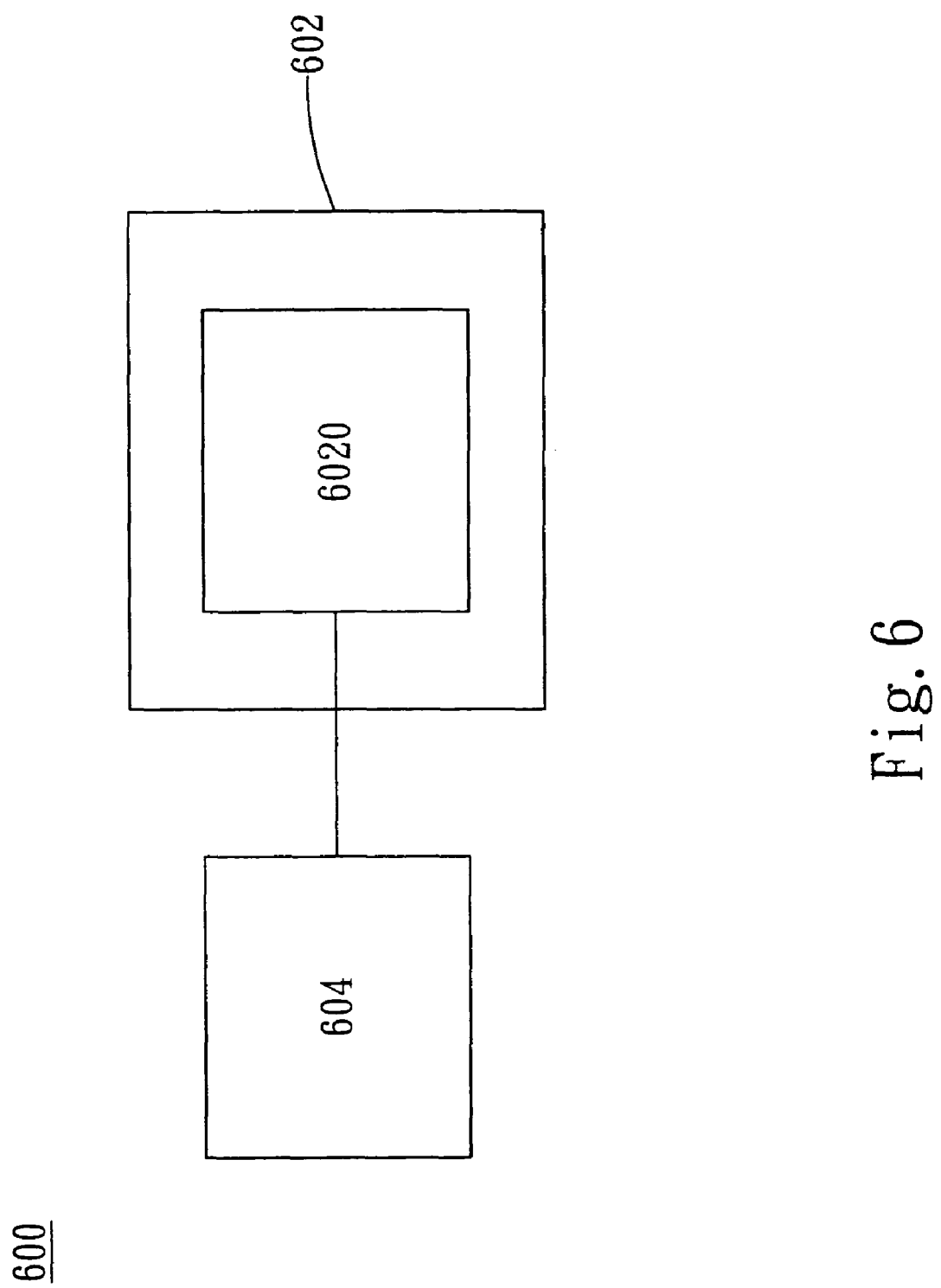
FIG. 6 is a schematic cross-sectional view showing an application example that uses a top-emission active matrix electroluminescent of the present invention.

A top-emission active matrix electroluminescent device of the present invention can be applied to an image display system 600, as shown in FIG. 6. The image display system 600 can include a display panel 602 and a power supply 604. The display panel 602, which includes an interface driving circuit 6020, can be one part of an electronic device. The power supply 604 is coupled to the display panel 602, providing power for it. Applications of the image display system 600 can include, without limitation, mobile phones, digital cameras, PDAs, notebook computers, desktop computers, TVs, GPS receivers, automotive display devices, aircraft display devices, digital photo frames, and portable DVD players.

While this invention has been described by way of examples and in terms of preferred embodiments, it is to be understood that this invention is not limited hereto, and that various changes, substitutions, and alterations can be made herein without departing from the spirit and scope of this invention as defined by the appended claims.

What is claimed is:

1. A top-emission active matrix electroluminescent device, including:
   a substrate; and
   a plurality of pixel areas formed within a display area of said substrate, each pixel area including at least one sub-pixel area comprising at least, from top to bottom: a first conductive electrode layer, an electroluminescent layer, a second conductive electrode layer, a first reflective layer region and a second reflective layer region, wherein said first reflective layer region and said second reflective layer region overlap each other in part.

2. The top-emission active matrix electroluminescent device according to claim 1, further including a passivation layer between said first reflective layer region and said second reflective layer region.

3. The top-emission active matrix electroluminescent device according to claim 2, wherein said second reflective layer region includes a second reflective layer which is the same metal layer constituting a metallic contact at a drain region of a corresponding driving TFT within said sub-pixel area.

4. The top-emission active matrix electroluminescent device according to claim 2, wherein said second reflective layer region includes a second reflective layer which is the same metal layer constituting a gate electrode of a corresponding driving TFT within said sub-pixel area.

5. The top-emission active matrix electroluminescent device according to claim 2, wherein the thickness of said passivation layer is greater than 1 μm.

6. The top-emission active matrix electroluminescent device according to claim 2, wherein the thickness of a part of the passivation layer corresponding to said first reflective layer region is greater than the thickness of a part of the passivation layer corresponding to said second reflective layer region.

7. The top-emission active matrix electroluminescent device according to claim 6, wherein said second reflective layer is the same metal layer constituting the metallic contact at a drain region of a corresponding driving TFT within said sub-pixel area.

8. The top-emission active matrix electroluminescent device according to claim 1, wherein said first reflective layer region comprises a first reflective layer being electrically coupled to said second conductive electrode layer.

9. The top-emission active matrix electroluminescent device according to claim 1, wherein said second reflective layer region includes a second reflective layer which is the same metal layer constituting a metallic contact at a drain region of a corresponding driving TFT within said sub-pixel area.

10. The top-emission active matrix electroluminescent device according to claim 1, wherein said second reflective layer is the same metal layer constituting a gate electrode of a corresponding driving TFT within said sub-pixel area.

11. The top-emission active matrix electroluminescent device according to claim 1, wherein the thickness of said first reflective layer region and the thickness of said second reflective layer region are smaller than 0.5 μm.

12. The top-emission active matrix electroluminescent device according to claim 1, wherein the reflectivity of said first reflective layer region and the reflectivity of said second reflective layer region are greater than 30%.

13. The top-emission active matrix electroluminescent device according to claim 12, wherein the reflectivity of said first reflective layer region and the reflectivity of said second reflective layer region range from 50% to 100%.

14. An image display system, including:
a display panel comprising a top-emission active matrix electroluminescent device as claimed in claim 1; and
a power supply electrically coupled to said display panel.

15. The image display system according to claim 14, wherein said image display system is a mobile phone, digital camera, PDA, notebook computer, desktop computer, TV, GPS receiver, automotive display device, aircraft display device, digital photo frame or portable DVD player.

16. The top-emission active matrix electroluminescent device according to claim 1, wherein said first reflective layer region and said second reflective layer region overlap each other in part below the electroluminescent layer within said at least one sub-pixel area, and wherein at least the first reflective layer region extends below only part of the electroluminescent layer within said at least one sub-pixel area.

17. A top-emission active matrix electroluminescent device, including:
a substrate; and
a plurality of pixel areas formed within a display area of said substrate, each pixel area including at least one sub-pixel area comprising at least, from top to bottom: a first conductive electrode layer, an electroluminescent layer, a second conductive electrode layer, a first reflective layer region, a second reflective layer region and a third reflective layer region, wherein said first reflective layer region and said second reflective layer region overlap each other in part, and wherein one side of said second reflective layer region, which is opposite to said first reflective layer region, and said third reflective layer region overlap each other in part.

18. The top-emission active matrix electroluminescent device according to claim 17, further including a passivation layer which is located under said first reflective layer region and which covers said second reflective layer region and said third reflective layer region.

19. The top-emission active matrix electroluminescent device according to claim 18, further including an insulating layer located between said second reflective layer region and said third reflective layer region.

20. The top-emission active matrix electroluminescent device according to claim 18, wherein the thickness of said passivation layer is greater than 1 μm.

21. The top-emission active matrix electroluminescent device according to claim 17, wherein said second reflective layer region includes a second reflective layer which is the same metal layer constituting the metallic contact at a drain region of a corresponding driving TFT within said sub-pixel area.

22. The top-emission active matrix electroluminescent device according to claim 21, wherein said third reflective layer region includes a third reflective layer which is the same metal layer constituting the gate electrode of a corresponding driving TFT within said sub-pixel area.

23. The top-emission active matrix electroluminescent device according to claim 17, wherein said third reflective layer region includes a third reflective layer which is the same metal layer constituting the gate electrode of a corresponding driving TFT within said sub-pixel area.

24. The top-emission active matrix electroluminescent device according to claim 17, wherein the thickness of said first reflective layer region, the thickness of said second reflective layer region, and the thickness of said third reflective layer region are smaller than 0.5 μm.

25. The top-emission active matrix electroluminescent device according to claim 17, wherein the reflectivity of said first reflective layer region, the reflectivity of said second reflective layer region, and the reflectivity of said third reflective layer region are greater than 30%.

26. The top-emission active matrix electroluminescent device according to claim 25, wherein the reflectivity of said first reflective layer region, the reflectivity of said second reflective layer region, and the reflectivity of said third reflective layer region range from 50% to 100%.

27. The top-emission active matrix electroluminescent device according to claim 17, wherein said first reflective layer region and said second reflective layer region overlap each other in part below the electroluminescent layer within said at least one sub-pixel area, and wherein at least the first reflective layer region extends below only part of the electroluminescent layer within said at least one sub-pixel area.

* * * * *